(12) United States Patent
Yamazaki et al.

(10) Patent No.: US 8,853,782 B2
(45) Date of Patent: Oct. 7, 2014

(54) SEMICONDUCTOR DEVICE

(75) Inventors: Shunpei Yamazaki, Tokyo (JP);
Yasuyuki Arai, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 387 days.

(21) Appl. No.: 11/946,513

(22) Filed: Nov. 28, 2007

(65) Prior Publication Data
US 2008/0128702 A1 Jun. 5, 2008

(30) Foreign Application Priority Data

Dec. 5, 2006 (JP) .................. 2006-327718

(51) Int. Cl.
*H01L 29/04* (2006.01)
*H01L 29/786* (2006.01)
*H01L 27/12* (2006.01)

(52) U.S. Cl.
CPC .......... *H01L 27/12* (2013.01); *H01L 29/78696* (2013.01); *H01L 27/1214* (2013.01)
USPC ........... 257/348; 257/347; 257/487; 257/496; 257/E29.002

(58) Field of Classification Search
USPC ......... 257/392, 402, 324, 354, 395, 406, 411, 257/637, 674, 648, E29.117, E29.133
See application file for complete search history.

(56) References Cited

U.S. PATENT DOCUMENTS

| | | | |
|---|---|---|---|
| 6,093,934 A | 7/2000 | Yamazaki et al. | |
| 6,140,667 A | 10/2000 | Yamazaki et al. | |
| 6,147,667 A | 11/2000 | Yamazaki et al. | |
| 6,198,141 B1 | 3/2001 | Yamazaki et al. | |
| 6,271,543 B1 | 8/2001 | Ohtani et al. | |
| 6,288,413 B1 | 9/2001 | Kamiura et al. | |
| 6,348,368 B1 | 2/2002 | Yamazaki et al. | |
| 6,365,917 B1 | 4/2002 | Yamazaki | |

(Continued)

FOREIGN PATENT DOCUMENTS

| | | |
|---|---|---|
| EP | 1 229 576 A2 | 8/2002 |
| EP | 1 536 482 A1 | 6/2005 |

(Continued)

OTHER PUBLICATIONS

Leobandung, E. et al, "High Performance 65nm SOI Technology with Dual Stress Liner and Low Capacitance SRAM Cell," 2005 Symposium on VLSI Technology Digest of Technical Papers, 2005, pp. 126-127.

(Continued)

*Primary Examiner* — Colleen Matthews
*Assistant Examiner* — William Harriston
(74) *Attorney, Agent, or Firm* — Husch Blackwell LLP

(57) ABSTRACT

A semiconductor device has a so-called SOI structure in which an element is constituted by a semiconductor layer on an insulating surface, and the semiconductor layer is extremely thin as 5 nm to 30 nm. The semiconductor device is provided with a field effect transistor that includes in addition to such a semiconductor layer, a gate insulating layer with a thickness of 2 nm to 20 nm and a gate electrode, and a channel length is ten times or more and less than 40 times the thickness of the semiconductor layer. When the semiconductor layer is formed to be thin, the semiconductor device operates so as not to be easily influenced by a concentration of impurity imparting one conductivity type added to a channel formation region.

22 Claims, 10 Drawing Sheets

(56) References Cited

U.S. PATENT DOCUMENTS

| | | |
|---|---|---|
| 6,380,560 B1 | 4/2002 | Yamazaki et al. |
| 6,388,270 B1 | 5/2002 | Yamazaki et al. |
| 6,396,147 B1 | 5/2002 | Adachi et al. |
| 6,452,211 B1 | 9/2002 | Ohtani et al. |
| 6,469,317 B1 | 10/2002 | Yamazaki et al. |
| 6,559,036 B1 | 5/2003 | Ohtani et al. |
| 6,627,505 B2 | 9/2003 | Adan |
| 6,909,114 B1 | 6/2005 | Yamazaki |
| 6,909,240 B2 | 6/2005 | Osame et al. |
| 6,939,755 B1 | 9/2005 | Ohtani et al. |
| 7,002,659 B1 | 2/2006 | Yamazaki et al. |
| 7,153,729 B1 | 12/2006 | Yamazaki et al. |
| 7,247,910 B2 | 7/2007 | Lee et al. |
| 7,374,981 B2 | 5/2008 | Yamaguchi et al. |
| 7,463,523 B2 | 12/2008 | Shino |
| 7,485,923 B2 | 2/2009 | Takemura et al. |
| 7,696,024 B2 | 4/2010 | Maruyama et al. |
| 7,843,010 B2 | 11/2010 | Kimura et al. |
| 8,120,111 B2 | 2/2012 | Yamaguchi et al. |
| 2003/0001159 A1* | 1/2003 | Ohtani et al. ............... 257/64 |
| 2003/0089905 A1 | 5/2003 | Udagawa et al. |
| 2003/0203523 A1 | 10/2003 | Yamazaki et al. |
| 2005/0029591 A1* | 2/2005 | Yudasaka et al. ........... 257/347 |
| 2005/0116305 A1 | 6/2005 | Hwang et al. |
| 2006/0102955 A1* | 5/2006 | Chen et al. ............... 257/349 |
| 2006/0138558 A1 | 6/2006 | Morikado |
| 2006/0205129 A1 | 9/2006 | Sato et al. |
| 2007/0281400 A1 | 12/2007 | Yamazaki et al. |
| 2008/0128703 A1 | 6/2008 | Ikeda et al. |
| 2008/0128808 A1* | 6/2008 | Yamazaki et al. ........... 257/347 |
| 2008/0191279 A1 | 8/2008 | Yamaguchi et al. |
| 2011/0027980 A1 | 2/2011 | Yamazaki et al. |
| 2011/0272700 A1 | 11/2011 | Yamaguchi et al. |

FOREIGN PATENT DOCUMENTS

| | | |
|---|---|---|
| JP | 9-116167 A | 5/1997 |
| JP | 11-345978 | 12/1999 |
| JP | 2000-101087 | 4/2000 |
| JP | 2000-114174 | 4/2000 |
| JP | 2000-260997 | 9/2000 |
| JP | 2000-277737 | 10/2000 |
| JP | 2000-294799 A | 10/2000 |
| JP | 2003-110105 | 4/2003 |
| JP | 2003-203925 | 7/2003 |
| JP | 2003-243415 | 8/2003 |
| JP | 2004-327977 | 11/2004 |
| JP | 2005-57042 | 3/2005 |
| JP | 2005-167207 | 6/2005 |
| JP | 2006-41265 | 2/2006 |
| JP | 2006-148049 | 6/2006 |
| JP | 2006-179746 | 7/2006 |
| JP | 2006-260722 | 9/2006 |
| JP | 2006-270076 | 10/2006 |
| KR | 1999-0006832 A | 1/1999 |
| KR | 10-0466061 | 1/2005 |
| WO | WO 2006/038351 A1 | 11/2004 |

OTHER PUBLICATIONS

Korean Office Action re Application No. KR 10-2007-0124719, dated Oct. 23, 2013.

* cited by examiner

SEMICONDUCTOR DEVICE

BACKGROUND OF THE INVENTION

1. Field of the Invention

The present invention relates to a semiconductor device formed using a semiconductor layer provided on an insulating surface, and particularly a miniaturization technique for a field effect transistor.

2. Description of the Related Art

A method is known, in which miniaturization of a thin film transistor (hereinafter, also referred to as "TFT") that is one kind of filed effect transistors is attempted by shortening a channel length represented as a distance between a source and a drain in order to achieve high performance. This is a method in which high-speed operation is attempted by shortening a traveling distance of carriers flowing through a channel of the transistor.

However, when the channel length is shortened, a phenomenon that threshold voltage is changed and leak current is increased between the source and the drain in a weak inversion state, which is a so-called short-channel effect, becomes prominent. Thus, a method is known, in which an impurity concentration in a channel formation region is increased to suppress expansion of a depletion layer, so that the short-channel effect is suppressed.

For example, a TFT is known, in which a gate electrode layer is formed to have two layers, and the width of a lower layer is smaller than that of an upper layer to reduce gate capacitance, so that the short channel effect is suppressed (for example, see Reference 1: Japanese Published Patent Application No. 2006-41265).

SUMMARY OF THE INVENTION

However, in the case where the gate electrode is formed to have a complicated shape in miniaturizing an integrated circuit, difficulty in the manufacturing process is increased. In the field effect transistor formed from polycrystalline silicon that is crystallized by irradiating a silicon thin film with laser irradiation, the crystal grain boundaries are formed at random, and the plane directions of crystals are nonuniform; therefore, the threshold voltage is drastically varied. In addition, the field effect transistor has a structural defect such that a substrate bias cannot be applied because a substrate supporting the semiconductor layer has an insulating property.

In view of such problems, it is an object of the present invention to achieve miniaturization and high performance of a field effect transistor that is formed on a substrate having an insulating surface. In particular, it is an object of the present invention to achieve miniaturization and high performance of a thin film transistor in which a channel formation region is formed in a semiconductor layer crystallized by irradiating a semiconductor film having an amorphous structure with heat or light energy.

An aspect of the present invention is a semiconductor device having a so-called SOI (silicon on insulator) structure in which an element is formed using a semiconductor layer on an insulating surface, and the semiconductor layer has an extremely thin thickness of 5 nm to 30 nm, preferably 10 nm to 25 nm. That is, an aspect of the present invention is a semiconductor device provided with a field effect transistor, which includes in addition to such a semiconductor layer, a gate insulating layer with a thickness of 2 nm to 20 nm and a gate electrode, and a channel length is ten times or more and less than forty times the thickness of the semiconductor layer, or is 100 nm or more and less than 1000 nm.

When the semiconductor layer is formed to be thin, the semiconductor layer operates so as not to be easily influenced by the concentration of an impurity imparting one conductivity type that is added to a channel formation region. Reduction in thickness of the semiconductor layer operates so that the entire region of the channel formation region is to be depleted.

According to the present invention, a transistor is provided, in which a semiconductor layer is thin, and a channel length is ten times or more and less than forty times the thickness of the semiconductor layer or is 100 nm or more and less than 1000 nm, whereby the short channel effect can be suppressed. Further, the threshold voltage of the transistor can be reduced. Consequently, a semiconductor device can be driven at low voltage, and low power consumption can be realized.

DETAILED DESCRIPTION OF THE INVENTION

Figure 1A:
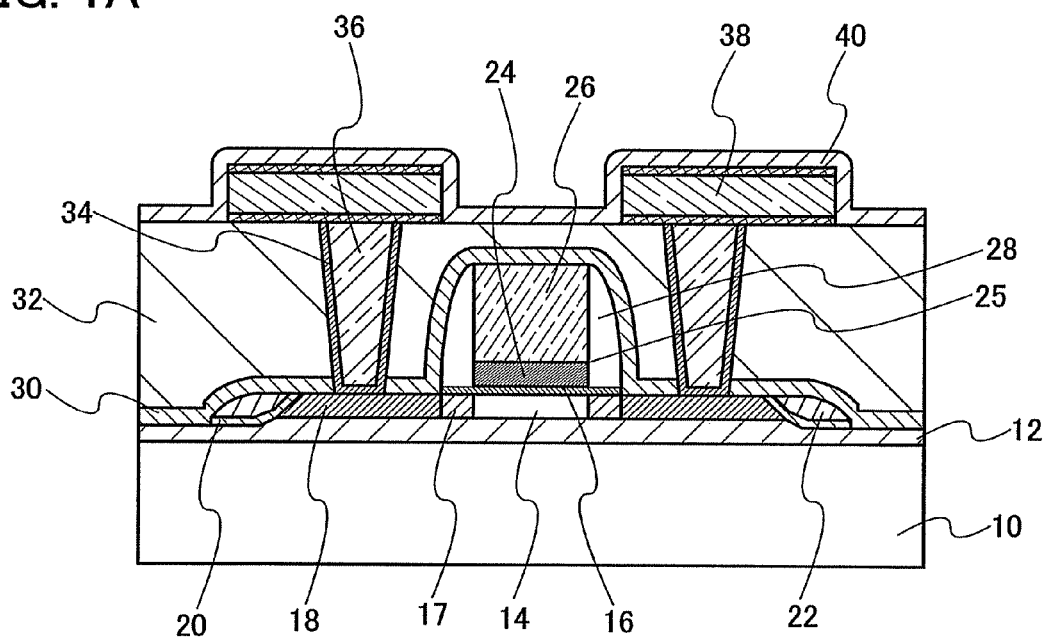
FIGS. 1A and 1B are views showing a structure of a filed effect transistor that is a main component of a semiconductor device of the present invention.

Embodiment mode of the present invention will be described with reference to the accompanying drawings. However, the present invention can be implemented in various ways, and it is easily understood by those skilled in the art that various changes and modifications are possible, unless such changes and modifications depart from the sprit and the scope of the invention. Therefore, the present invention is not construed as being limited to the description of the following embodiment mode. It is to be noted that like portions in the drawings of the present invention to be given below may be denoted by like reference numerals in the drawings.

Figure 1B:
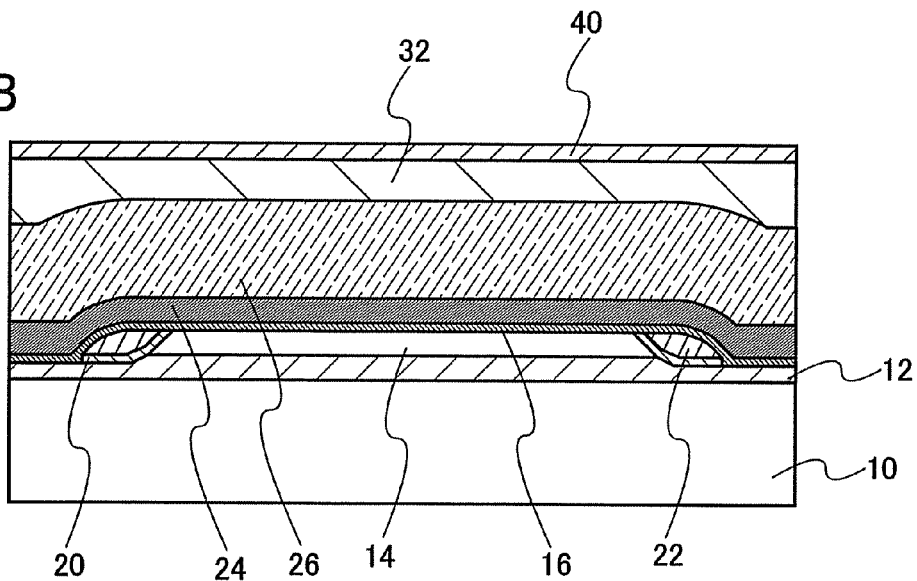

FIGS. 1A and 1B show a structure of a field effect transistor that is a main component of a semiconductor device of the present invention. FIG. 1A is a cross-sectional view of the field effect transistor in a channel length direction, and FIG. 1B is a cross-sectional view thereof in a channel width direction (direction perpendicular to the channel length direction). This field effect transistor is formed using a substrate 10 having an insulating surface. As the substrate 10 having an insulating surface, a glass substrate, a quartz substrate, a sapphire substrate, a ceramic substrate, a metal substrate having an insulating layer formed on its surface, or the like can be used.

A semiconductor layer 14 is provided over the substrate 10 having an insulating surface. In FIGS. 1A and 1B, a base insulating layer 12 is formed between the substrate 10 and the semiconductor layer 14. The base insulating layer 12 is provided to prevent contamination of the semiconductor layer 14 by sodium or the like entered from the substrate 10. Accordingly, in the case where a quartz substrate or the like is selected as a material of the substrate 10, the base insulating layer 12 can be omitted.

The base insulating layer 12 is formed using an insulating material such as silicon oxide, silicon nitride, silicon oxynitride ($SiO_xN_y$)(x>y>0), silicon nitride oxide ($SiN_xO_y$) (x>y>0), or the like by a CVD method, a sputtering method, or the like. For example, when the base insulating layer 12 is formed to have a two-layer structure, a silicon nitride oxide film may be formed as a first insulating film, and a silicon oxynitride film may be formed as a second insulating film. Alternatively, as the first insulating film, a silicon nitride film may be formed, and a silicon oxide film may be formed as the second insulating film.

The semiconductor layer 14 is preferably formed using a single crystalline semiconductor or a crystalline semiconductor. For example, after a semiconductor film formed over the entire surface of the substrate 10 by a sputtering method, a plasma CVD method, or a low pressure CVD method is crystallized, the semiconductor film is selectively etched so that the semiconductor layer 14 can be formed. That is, island-shaped semiconductor layers are formed on an insulating surface for the purpose of element isolation, and one or a plurality of nonvolatile memory elements is/are preferably formed in the semiconductor layer. As a semiconductor material, silicon is preferable, and in addition, a silicon germanium semiconductor can be used. As a crystallization method of the semiconductor film, a laser crystallization method, a crystallization method by thermal treatment using rapid thermal annealing (RTA) or an annealing furnace, a crystallization method using a metal element that promotes crystallization, or a method that is performed by combining these methods can be adopted. A semiconductor layer formed of the crystalline semiconductor manufactured in such a manner has a plurality of crystalline regions whose plane directions differ from each other. Consequently, even in a case where a channel length is ten times or more and less than forty times the thickness of the semiconductor layer, or is 100 nm or more and less than 1000 nm, variation of transistor characteristics can be suppressed by the presence of a plurality of crystal grains in a channel formation region. Instead of the process of forming such a thin film, an SOI substrate provided with a single crystalline semiconductor layer on an insulating surface may be used.

The thickness of the semiconductor layer 14 is 5 nm to 30 nm, preferably 10 nm to 25 nm. By reducing the thickness of the semiconductor layer, the short channel effect can be suppressed. In addition, the threshold voltage of the transistor can be reduced, and the transistor can be driven at a low voltage. The semiconductor layer 14 is formed to have a tilt angle (taper angle) at end portions. The angle is preferably 45° to 95°. In order to avoid influence by formation of a parasitic transistor in this region, whose characteristics are different from those of a center part of the semiconductor layer 14, it is preferable that the tilt angle be at approximately a right angle.

An insulating layer 20 is provided at an end portion of the semiconductor layer 14. This insulating layer 20 is preferably formed using silicon nitride at the end portion of the semiconductor layer 14 continuously toward the base insulating layer 12. Such a structure can prevent, when thermal treatment is performed in a manufacturing process of the field effect transistor, formation of an oxide film, so-called bird's beak on the bottom surface of the semiconductor layer 14. The bird's beak applies exogenous stress to the semiconductor layer 14, and electric stress is easily accumulated in the semiconductor layer 14; therefore, the bird's beak adversely affects the characteristics of the field effect transistor. However, such a problem can be solved by providing the insulating layer 20.

P-type impurities may be injected into the semiconductor layer 14. As p-type impurities, boron is used for example and added at a concentration of greater than or equal to $5\times10^{17}$ $cm^{-3}$ and less than or equal to $1\times10^{18}$ $cm^{-3}$. This is because the threshold voltage of the transistor is controlled, and the control is effectively conducted by adding the p-type impurities to the channel formation region in the semiconductor layer 14. The channel formation region is formed in a region roughly below a gate electrode 25 described afterwards, and positioned between a pair of first impurity regions 18 of the semiconductor layer 14.

The first impurity regions 18 are regions each serving as a source region or a drain region in the transistor. The first impurity regions 18 are formed by adding phosphorus or arsenic that is an n-type impurity at a peak concentration of approximately $1\times10^{21}$ $cm^3$.

A gate insulating layer 16 and the gate electrode 25 are provided over the semiconductor layer 14. The gate insulating layer 16 is formed to have a thickness of 2 nm to 20 nm. The gate insulating layer is formed to be thin so as to make the transistor operate at high speed and a low voltage.

The gate insulating layer 16 is formed of a silicon oxide layer or has a stacked structure of a silicon oxide layer and a silicon nitride layer. Although the gate insulating layer 16 may be formed by depositing an insulating film by a plasma CVD method or a low pressure CVD method, it is preferably formed by solid-phase oxidation or solid-phase nitridation by plasma treatment. This is because the gate insulating layer 16 formed by oxidizing or nitriding the semiconductor layer 14 by plasma treatment is dense and has high dielectric strength voltage and high reliability. This gate insulating layer 16 is preferably formed to have a thickness of 2 nm to 20 nm, further preferably 5 nm to 10 nm. In a case where the channel length is 100 nm or more and less than 1000 nm, typically 250 nm to 650 nm, the gate insulating layer 16 is formed to have a thickness of 5 nm to 15 nm.

In the solid-phase oxidation treatment or solid-phase nitridation treatment by the plasma treatment, plasma is preferably used, which is excited by microwaves (typically, 2.45 GHz) and has an electron density of greater than or equal to $1\times10^{11}$ $cm^{-3}$ and less than or equal to $1\times10^{13}$ $cm^{-3}$ and electron temperatures of greater than or equal to 0.5 eV and less than or equal to 1.5 eV. This condition is employed so that a dense insulating film is formed and a practical reaction speed is obtained in the solid-phase oxidation treatment or solid-phase nitridation treatment at temperature of 500° C. or less.

When the surface of the semiconductor layer 14 is oxidized by the plasma treatment, the plasma treatment is performed under an oxygen atmosphere (for example, an atmosphere containing oxygen ($O_2$) or dinitrogen monoxide ($N_2O$) and a rare gas (containing at least one of He, Ne, Ar, Kr, and Xe), or an atmosphere containing oxygen or dinitrogen monoxide, hydrogen ($H_2$), and a rare gas). Further, when the surface of the semiconductor layer 14 is nitrided by the plasma treatment, the plasma treatment is performed under a nitrogen atmosphere (for example, an atmosphere containing nitrogen (N$_2$) and a rare gas (containing at least one of He, Ne, Ar, Kr, and Xe), an atmosphere containing nitrogen, hydrogen, and a rare gas, or an atmosphere containing NH$_3$ and a rare gas). As the rare gas, Ar can be used, for example. Alternatively, a gas in which Ar and Kr are mixed may also be used.

Figure 2:
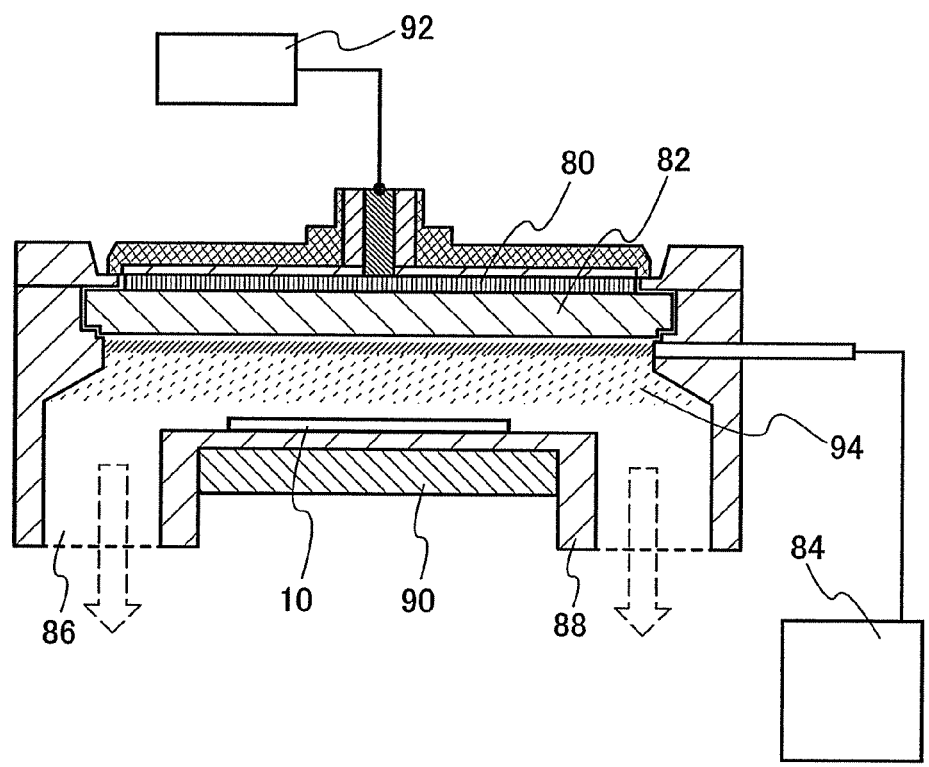
FIG. 2 is a view showing a structure of an apparatus for performing plasma treatment.

FIG. 2 shows a structure of an apparatus for performing plasma treatment. The plasma treatment apparatus includes a support 88 on which the substrate 10 is to be arranged, a gas supplying portion 84 for introducing a gas, an exhaust port 86 connected to a vacuum pump for exhausting a gas, an antenna 80, a dielectric plate 82, and a microwave supplying portion 92 which supplies a microwave for plasma generation. In addition, the temperature of the substrate 10 can be controlled by a temperature controlling portion 90 provided for the support 88.

Hereinafter, plasma treatment will be described. It is to be noted that the plasma treatment includes oxidation treatment, nitridation treatment, oxynitridation treatment, hydrogenation treatment, and surface modification treatment performed to a semiconductor layer, an insulating layer, and a conductive layer. For these treatment, a gas supplied from the gas supplying portion 84 may be selected in accordance with an intended purpose.

Oxidation treatment or nitridation treatment may be performed to the semiconductor layer as follows. First, a processing chamber is made in vacuum and a gas containing oxygen or nitrogen for plasma treatment is introduced from the gas supplying portion 84. The substrate 10 is heated at room temperature or at temperatures of 100 to 550° C. by the temperature controlling portion 90. It is to be noted that the distance between the substrate 10 and the dielectric plate 82 is 20 mm to 80 mm (preferably 20 mm to 60 mm).

Next, microwaves are supplied from the microwave supplying portion 92 to the antenna 80. Then, the microwaves are introduced from the antenna 80 into the processing chamber through the dielectric plate 82; thus, plasma 94 is generated. When the plasma is excited by the introduced microwaves, plasma which has the low electron temperature (less than or equal to 3 eV, preferably less than or equal to 1.5 eV) and the high electron density ($1\times10^{11}$ cm$^{-3}$ or more) can be generated. With oxygen radicals (containing OH radicals in some cases) and/or nitrogen radicals (containing NH radicals in some cases) generated by this high-density plasma, the surface of the semiconductor layer can be oxidized or nitrided. A plasma treatment gas mixed with a rare gas such as argon enables oxygen radicals or nitrogen radicals to be generated efficiently due to excited species of a rare gas. In this method, through the effective use of active radicals excited by plasma, oxidation or nitridation treatment, or concurrent treatment of oxygen and nitridation by a solid-phase reaction can be performed at low temperatures of less than or equal to 500° C.

In FIGS. 1A and 1B, as one preferable example of the gate insulating layer 16 formed by the plasma treatment, a layer having a stacked structure of a silicon oxide layer and a silicon nitride layer. The silicon oxide layer is formed over a surface of a silicon layer typified by the semiconductor layer 14 with a thickness of 3 nm to 6 nm by the plasma treatment under an oxygen atmosphere. The silicon nitride layer is formed by nitriding the surface of the silicon oxide layer in a nitrogen atmosphere after formation of the silicon oxide layer. The surface of the semiconductor layer 14 is oxidized by plasma treatment, whereby a dense oxide film without distortions at the interface can be formed. Further, when a nitride layer is formed by nitridation of the oxide layer by plasma treatment and replacement of oxygen on the surface with nitrogen, the oxide film can be further denser. Accordingly, an insulating layer having high dielectric voltage can be formed.

In any case, through the use of solid-phase oxidation treatment or solid-phase nitridation treatment by the plasma treatment as described above, an insulating layer similar to a thermal oxide film, which is formed at 950° C. to 1050° C., can be obtained even with the use of a glass substrate having a temperature limit of less than or equal to 700° C. In other words, a film having high reliability can be formed as a gate insulating layer of a transistor.

As the gate insulating layer 16, a high dielectric constant material may be used. When a high dielectric constant material is used for the gate insulating layer 16, gate leak current can be reduced. As the high dielectric constant material, zirconium dioxide, hafnium oxide, titanium dioxide, tantalum pentoxide, or the like can be used. Further, a silicon oxide layer may be formed by solid-phase oxidation by plasma treatment.

The gate electrode 25 is preferably formed of metal or metal nitride. When metal or metal nitride is used, depletion of the gate electrode can be eliminated, and the current drive capability of the transistor can be improved.

In FIGS. 1A and 1B, as a structure of the gate electrode 25, a structure in which a first gate electrode layer 24 and a second gate electrode layer 26 are stacked is illustrated. The first gate electrode layer 24 is formed of metal nitride. As the metal nitride, titanium nitride, tantalum nitride, tungsten nitride, chromium nitride, molybdenum nitride, or the like can be used. The second gate electrode layer 26 is formed of metal (preferably, refractory metal). As the metal, tungsten, titanium, molybdenum, tantalum, chromium, or the like can be used. These metals have a high melting point and thermal stability; therefore, they are easily handled in a manufacturing process. The first and second electrode layers 24 and 26 can be formed using metal nitride and metal by a sputtering method, an electron beam evaporation method, a metal organic CVD method, or the like.

When the extremely thin gate insulating layer 16 is formed, a gate leak current may be increased at step portions (end regions of the semiconductor layer 14) of a region where the semiconductor layer 14 and the gate electrode 25 intersect with each other. This is mainly caused by a shape, and unevenness thickness of the gate insulating layer 16, damage caused in forming the gate electrode layer, and the like are causes. When the gate insulating layer 16 is formed to be thin, it is preferable that a thickness of the insulating layer covering side edge portions of the semiconductor layer 14 be thicker than the thickness of the gate insulating layer 16.

In FIGS. 1A and 1B, side-wall insulating layers 22 are formed using silicon oxide, silicon nitride, or the like. By providing the side-wall insulating layer 22, a portion which crosses the step of the gate insulating layer 16 can be positioned at outside of the semiconductor layer 14. After the semiconductor layer 14 is formed, a silicon oxide film or a silicon nitride film is deposited and processed by anisotropic etching, so that the side-wall insulating layer 22 can be formed in a self-aligned manner. The side-wall insulating layer 22 may be formed of a low dielectric constant material whose relative dielectric constant is 2.5 or less. As the low dielectric constant material, porous silicon oxide manufactured by a CVD method, carbon, silicon oxide containing fluorine, or the like can be used. By forming the side-wall insulating layer 22 using a low dielectric constant material, effect similar to the case where the side-wall insulating layer 22 is formed to be thick can be obtained.

Sidewall insulating layers 28 are formed at side faces of the gate electrode 25 using silicon nitride or silicon oxide. Second impurity regions 17 may be formed utilizing these sidewall insulating layers 28. Impurities imparting one conductivity type are added so that the concentration of the impurities in the second impurity regions 17 is lower than that of the first impurity regions 18; therefore, the second impurity regions 17 serve as a low concentration drain.

A passivation layer 30 is formed using silicon nitride. In order to form wirings 38 connected to the source and the drain, a BPSG (boron phosphorus silicon glass) film is formed and planarized by reflow so that an interlayer insulating layer 32 is formed. Alternatively, a silicon oxide film is formed using TEOS (tetraethoxysilane) and planarized by chemical mechanical polishing treatment as the interlayer insulating layer 32. Contact holes are formed in the interlayer insulating layer 32, and titanium films or titanium nitride films are formed as barrier metals 34. In the contact holes, contact plugs 36 are formed using tungsten hexafluoride by a CVD method. The wirings 38 are formed to have a three-layer structure in which aluminum or an aluminum alloy is sandwiched between barrier metal films, and the barrier metal films of a lower layer and an upper layer are formed of metal films such as a molybdenum film, a chromium film, or a titanium film. Next, a passivation layer 40 is formed over the wirings 38.

As shown in FIGS. 1A and 1B, a field effect transistor is formed in which the thickness of the semiconductor layer is as thin as 10 nm to 25 nm, the thickness of the gate insulating layer is 2 nm to 20 nm, and the channel length is ten times or more and less than forty times the thickness of the semiconductor layer or is 100 nm or more and less than 1000 nm, typically 250 nm to 650 nm, whereby the short channel effect can be suppressed. In addition, the threshold voltage of the transistor can be reduced. In other words, a field effect transistor whose threshold voltage is 0.01 V or more and less than 0.62 V and sub-threshold value is 60 mV/decade or more and less than 100 mV/decade can be obtained.

Hereinafter, suppression of the short channel effect is shown by forming a field effect transistor in which a semiconductor layer is formed to be thin and the concentration of impurity imparting one conductivity type in a channel formation region is set within a predetermined range. In addition, it is shown that the threshold voltage of the transistor can be reduced. For calculation, TCAD software manufactured by Synopsys, Inc., Sentaurus, was used.

Figure 3:
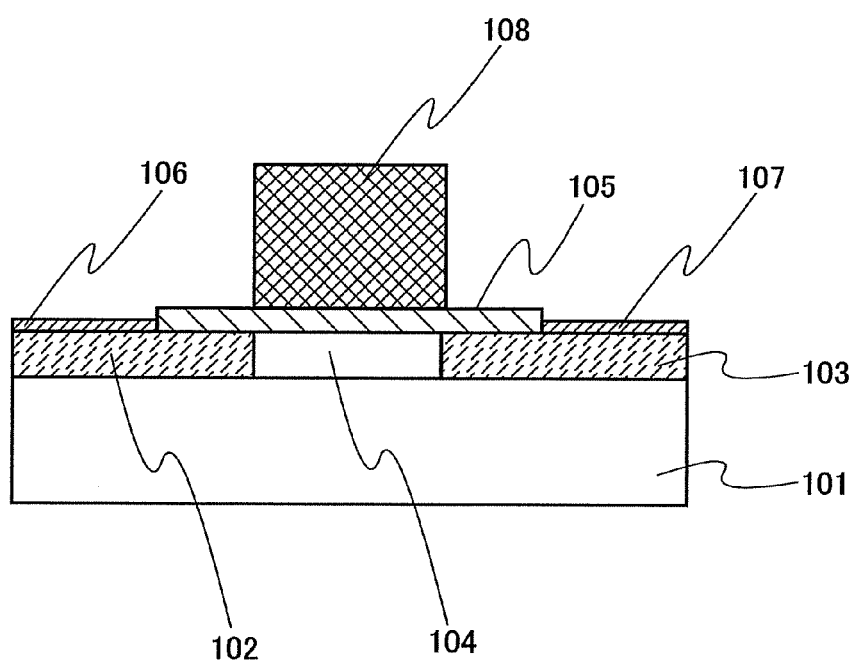
FIG. 3 is a cross-sectional view of a structure of a field effect transistor that is used for calculation.

FIG. 3 shows a cross-sectional view of an n-channel field effect transistor used for theoretical calculation. In FIG. 3, reference numeral 101 denotes a substrate; 102, a source region; 103, a drain region; 104, a channel formation region; 105, a gate insulating layer; 106, a source electrode; 107, a drain electrode; and 108, a gate electrode. Conditions used for the calculation are as follows: a material of the substrate 101 and the gate insulating layer 105 is silicon oxide ($SiO_2$); the thickness of the gate insulating layer 105 is 10 nm; the silicon thickness of the channel formation region 104 is 20 nm, 30 nm, or 50 nm; the channel length is 0.1 µm to 1.0 µm; in the channel formation region 104, the concentration of an impurity element imparting p-type conductivity is within the concentration range of $1 \times 10^{16}$ to $1 \times 10^{18}$ cm$^{-3}$; source potential is 0 V; drain potential is 0.1 V; and gate potential is −3 V to +3 V. Calculation was performed three times for cases where the silicon thickness of the channel formation region 104 is 20 nm, where 30 nm, and where 50 nm.

Figure 4A:
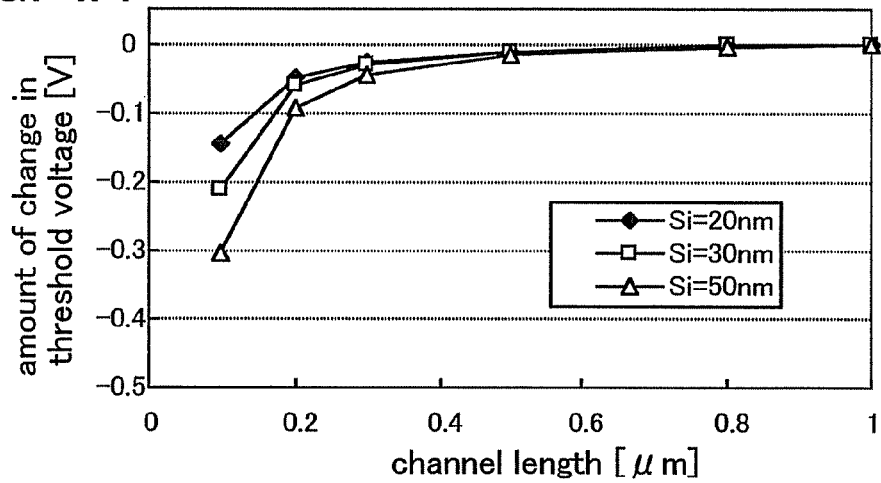
FIGS. 4A to 4C are graphs each showing threshold voltage determined from the gate voltage vs. drain current characteristics of a field effect transistor.
Figure 4B:
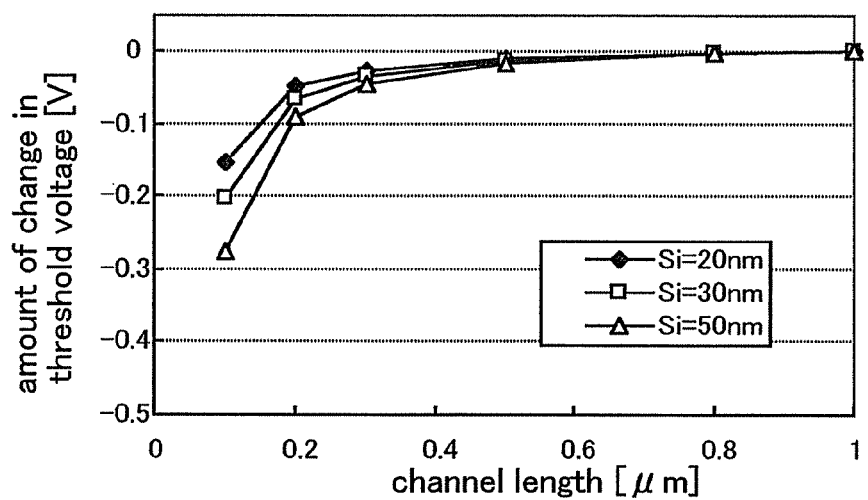
Figure 4C:
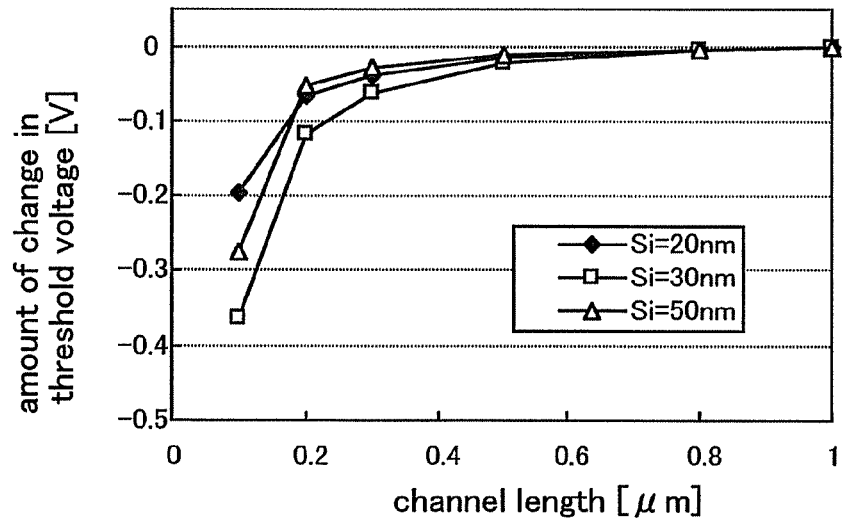

FIGS. 4A to 4C each show a threshold voltage determined from the gate voltage vs. drain current characteristics of the n-channel field effect transistor. In graphs of FIGS. 4A to 4C, horizontal axes each indicate a channel length, and vertical axes each indicate the amount of change in the threshold voltage based on the threshold voltage where the channel length is 1 µm. FIG. 4A shows a calculation result in the case where the concentration of an impurity element imparting p-type conductivity in the channel formation region 104 is $1 \times 10^{16}$ cm$^{-3}$. FIG. 4B shows a calculation result in the case where the concentration of the impurity element is $1 \times 10^{17}$ cm$^{-3}$. FIG. 4C shows a calculation result in the case where the concentration of the impurity element is $1 \times 10^{18}$ cm$^{-3}$. These results show that when the channel length is of 0.1 µm to 0.5 µm, the amount of change in threshold voltage toward more negative values is smaller in the channel formation region 104 whose thickness is further reduced.

Figure 5A:
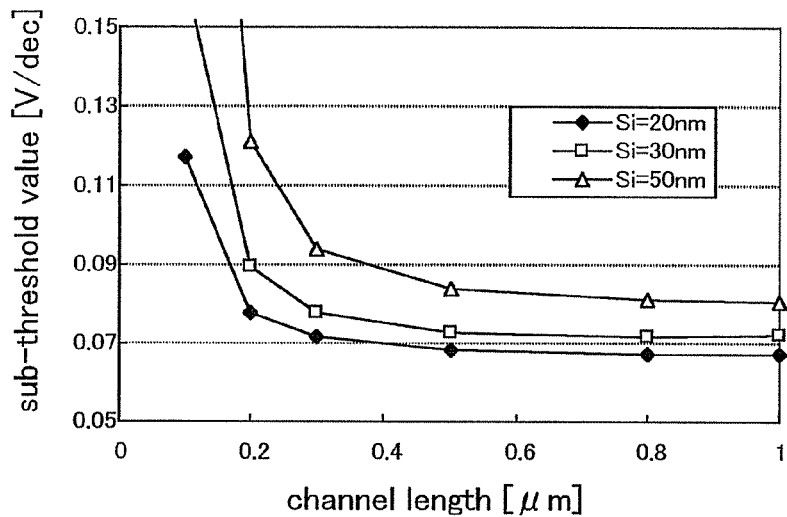
FIGS. 5A to 5C are graphs each showing sub-threshold value determined from the gate voltage vs. drain current characteristics of a field effect transistor.
Figure 5B:
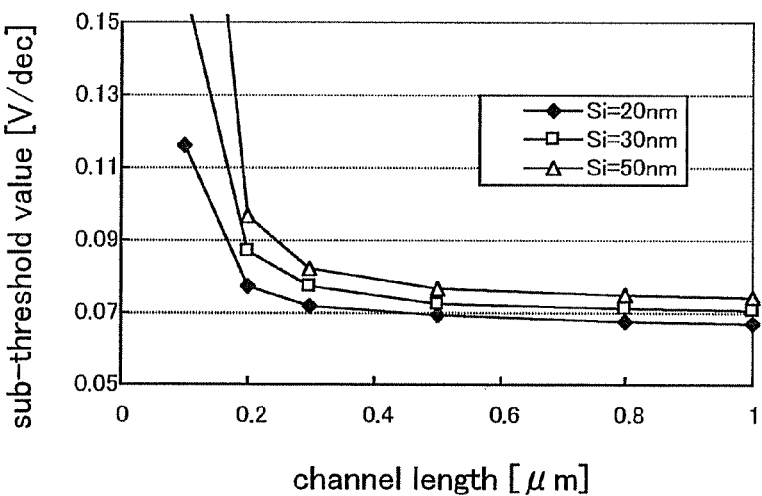
Figure 5C:
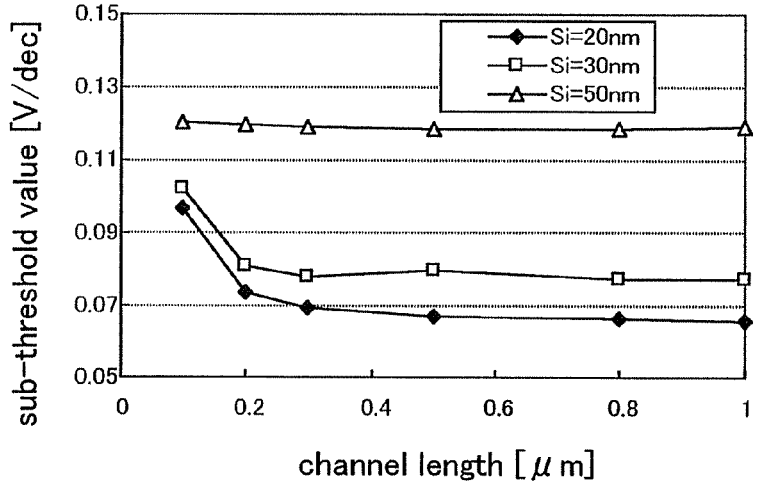

FIGS. 5A to 5C each show a sub-threshold value determined from the gate voltage vs. drain current characteristics of the n-channel field effect transistor. In FIGS. 5A to 5C, horizontal axes each indicate a channel length, and vertical axes each indicate a sub-threshold value. FIG. 5A shows a calculation result in the case where the concentration of an impurity element imparting p-type conductivity in the channel formation region 104 is $1 \times 10^{16}$ cm$^{-3}$. FIG. 5B shows a calculation result in the case where the concentration of the impurity element is $1 \times 10^{17}$ cm$^{-3}$. FIG. 5C shows a calculation result in the case where the concentration of the impurity element is $1 \times 10^{18}$ cm$^{-3}$. According to these results, as the channel formation region 104 is formed to be thinner, the sub-threshold value is decreased independently of the channel length. In the case where the concentration of the impurity element of the channel formation region 104 is $1 \times 10^{18}$ cm$^{-3}$ and the thickness of the channel formation region 104 is 50 nm, the sub-threshold value is increased. This is because the channel formation region 104 has high impurity concentration and a partial depletion structure. It is found that increase in the sub-threshold value with the channel length of 0.1 µm to 0.5 µm can be suppressed by reducing the thickness of the channel formation region 104. Furthermore, it is also found that increase of the sub-threshold value can be further suppressed by increasing the impurity concentration of the channel formation region 104 to $1 \times 10^{18}$ cm$^{-3}$. Since the sub-threshold value is reduced, the threshold voltage can be reduced while suppressing current flowing between the source and the drain at a gate voltage of 0 V.

The theoretical calculation shows that the amount of change in the threshold voltage toward negative values can be suppressed in a region where the channel length is as short as 0.1 µm to 0.5 µm, and increase of the sub-threshold value can be suppressed by reducing the thickness of the channel formation region 104. Hereinafter, reasons thereof are explained. When the channel formation region 104 is thick, in a case of short channel length, current flows on the lower side (side near the substrate) in the channel formation region 104 in a sub-threshold region where the value of the gate voltage is less than or equal to the threshold voltage by the influence of electric field between the source and the drain. Therefore, the sub-threshold value is increased, and the threshold voltage is reduced. When the channel formation region 104 is formed to be thin, a path where current flows on the lower side in the channel formation region 104 is blocked, leak current can be suppressed. Therefore, increase in the sub-threshold value is suppressed, and reduction in the threshold voltage is suppressed. Accordingly, when the channel formation region 104 is formed to be thin, the amount of change in the threshold voltage toward negative values can be suppressed in a region where the channel length is short, and a field effect transistor whose sub-threshold value is small can be manufactured.

Next, a method for manufacturing a field effect transistor as shown in FIGS. 1A and 1B will be described with reference to FIGS. 6A to 6F.

Figure 6A:
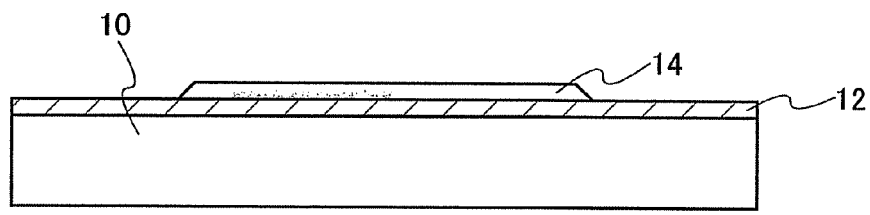
FIGS. 6A to 6F are cross-sectional views showing a method for manufacturing a field effect transistor.

In FIG. 6A, a base insulating layer 12 is formed over a substrate 10. A semiconductor layer 14 is formed using a crystalline semiconductor. For formation thereof, an amorphous silicon film is deposited by a sputtering method, a plasma CVD method, or a low pressure CVD method, and thereafter, the amorphous silicon film is crystallized by irradiation with continuous wave laser light or pulsed laser light to form a crystalline semiconductor. The thickness of the semiconductor layer 14 is 5 nm to 30 nm, preferably 10 nm to 25 nm. In order to set the thickness within this range, after the amorphous silicon film is deposited to have a thickness within the range, the crystallization may be performed. Alternatively, after an amorphous silicon film with a thickness of 50 nm to 150 nm is crystallized, the thickness of amorphous silicon film may be reduced by etching or grinding and polishing.

A p-type impurity such as boron, aluminum, or gallium is added to the semiconductor layer 14 in order to control the threshold voltage. For example, as a p-type impurity, boron is added at a concentration of greater than or equal to $5\times10^{17}$ cm$^{-3}$ and less than or equal to $1\times10^{18}$ cm$^{-3}$.

The semiconductor layer 14 is preferably processed to have an end portion with a tilt angle (taper angle). This is because, when the semiconductor layer 14 is nitrided by plasma treatment in the subsequent step, reduction in a thickness of the nitride film is prevented in the end region.

Figure 6B:
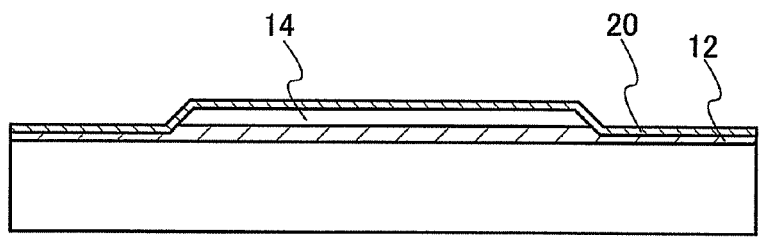

FIG. 6B shows a step of forming an insulating layer 20 by nitriding a surface of the semiconductor layer 14 by plasma treatment. This step is performed to protect the semiconductor layer 14 and prevent formation of a bird's beak at a bottom surface of the semiconductor layer 14. The bird's beak applies exogenous stress to the semiconductor layer 14, and electric stress is easily accumulated in the semiconductor layer 14; therefore, the bird's beak adversely affects the characteristics of a field effect transistor. However, by providing the insulating layer 20, distortion of the semiconductor layer 14 can be prevented. The thickness of the insulating layer 20 is 1 nm to 5 nm.

Solid-phase nitridation treatment by plasma treatment is preferably performed using plasma that is excited by micro waves (typically, 2.45 GHz), and has an electron density of greater than or equal to $1\times10^{11}$ cm$^{-3}$ and less than or equal to $1\times10^{13}$ cm$^{-3}$ and an electron temperature of greater than or equal to 0.5 eV and less than or equal to 1.5 eV. In a case of nitriding the semiconductor layer 14 by plasma treatment, the treatment is performed under a nitrogen atmosphere (e.g., an atmosphere containing nitrogen ($N_2$) and a rare gas (containing at least one of He, Ne, Ar, Kr, and Xe); an atmosphere containing nitrogen, hydrogen, and a rare gas; or an atmosphere containing $NH_3$ and a rare gas). As the rare gas, for example, Ar can be used. Alternatively, a gas in which Ar and Kr are mixed may be used. In this case, the surface of the semiconductor layer 14 and a surface of the base insulating layer 12 are nitrided.

Figure 6C:
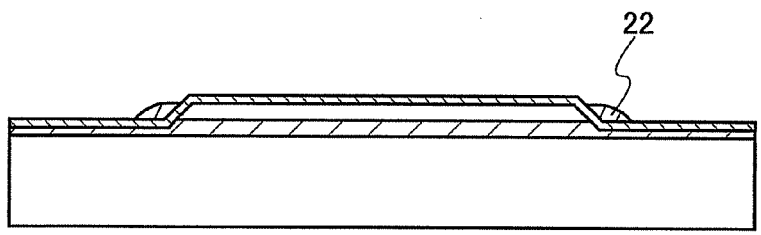

After that, as shown in FIG. 6C, an insulating film is formed so that the semiconductor layer 14 is embedded therein, and the insulating film is processed so that side-wall insulating layers 22 are formed at side surfaces of the semiconductor layer 14 by anisotropic etching. The side-wall insulating layer 22 is formed using silicon oxide or silicon nitride. In addition, the side-wall insulating layer 22 may also be formed using a low dielectric constant material whose relative dielectric constant is 2.5 or less. As the low dielectric constant material, a porous silicon oxide, carbon, silicon oxide containing fluorine, or the like can be used.

Figure 6D:
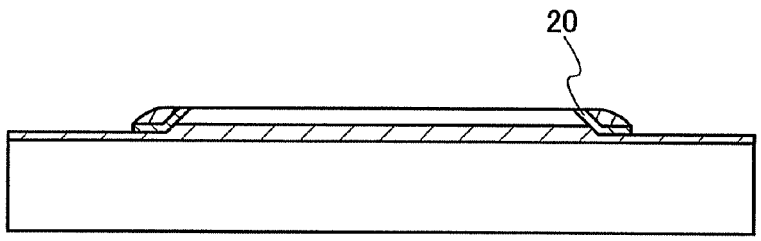

After the side-wall insulating layer 22 is formed, the insulating layer 20 over the semiconductor layer 14 is removed by etching as shown in FIG. 6D. Etching conditions may be set as appropriate. For example, the insulating layer 20 is etched using an etching gas such as $CF_4$ and $O_2$. In order to improve the etching rate with respect to the semiconductor layer 14, the etching gas is preferably switched to $CHF_3$. Etching for forming the side-wall insulating layer 22 shown in FIG. 6C and etching for removing the insulating layer 20 may be concurrently performed. For example, when anisotropic etching is performed using $CHF_3$ as an etching gas by which the etching rate of silicon oxide is approximately equal to that of silicon nitride, the side-wall insulating layer 22 and the insulating layer 20 that is overlapped by the side-wall insulating layer 22 can be left as shown in FIG. 6D.

Gentle steps formed by the insulating layer 20 and the side-wall insulating layer 22 are provided for end portions of the semiconductor layer 14, so that a portion which crosses the step of a gate insulating layer 16 can be positioned at outside of the semiconductor layer 14.

Figure 6E:
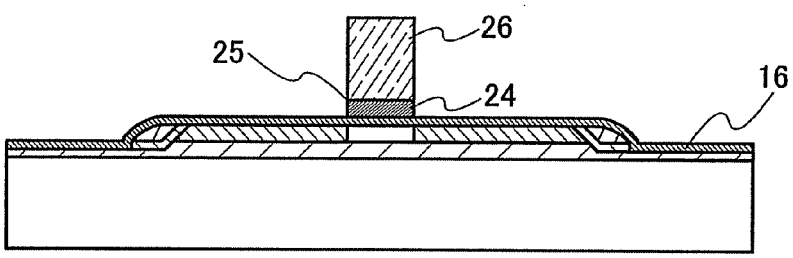

FIG. 6E shows a step of forming the gate insulating layer 16 and a gate electrode 25. The gate insulating layer 16 is formed to have a thickness of 2 nm to 20 nm. By using a high dielectric constant material for the gate insulating layer 16 in addition to silicon oxide, gate leak current can be reduced. As the high dielectric constant material, zirconium dioxide, hafnium oxide, titanium dioxide, tantalum pentoxide, or the like can be used.

The gate electrode 25 is preferably formed of metal or metal nitride. When metal or metal nitride is used, depletion of the gate electrode can be eliminated, and the current drive capability of the transistor can be improved. A first gate electrode layer 24 is formed of metal nitride. As the metal nitride, titanium nitride, tantalum nitride, tungsten nitride, chromium nitride, molybdenum nitride, or the like can be used. A second gate electrode layer 26 is formed of metal (preferably, refractory metal). As the metal, tungsten, titanium, molybdenum, tantalum, chromium, or the like can be used. These metals have a high melting point and thermal stability; therefore, they are easily handled in manufacturing the transistor. The first and second electrode layers 24 and 26 can be formed using metal nitride and metal by a sputtering method, an electron beam evaporation method, a metal organic CVD method, or the like.

In this situation, second impurity regions 17 are formed using the gate electrode 25 as a mask. In the case of an n-channel field effect transistor, an n-type impurity such as phosphorus is added so that the second impurity regions 17 serve as a low concentration drain.

Figure 6F:
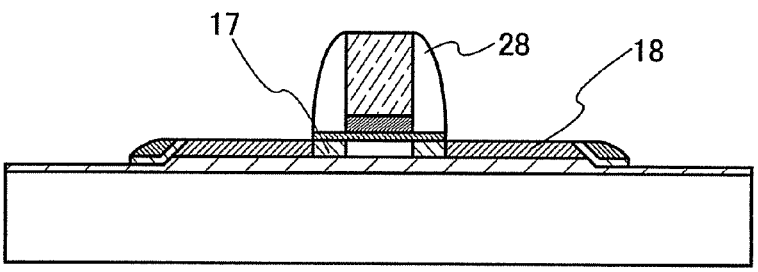

FIG. 6F shows a step of forming sidewall insulating layers 28 using silicon nitride or silicon oxide at side surfaces of the gate electrode 25. For formation of the sidewall insulating layer 28, a silicon nitride film or a silicon oxide film is deposited by a CVD method so that the gate electrode 25 is embedded therein, and the film is processed by anisotropic etching to leave insulating layers at the side surfaces of the gate electrode 25 (side walls). First impurity regions 18 for forming a source region and a drain region are formed using the sidewall insulating layers 28 as masks.

Then, a passivation layer, an interlayer insulating layer, and a wiring are formed, whereby a field effect transistor shown in FIGS. 1A and 1B can be obtained.

Next, a semiconductor device in which an insulating layer is embedded between a plurality of semiconductor layers as an element isolation structure will be described with reference to FIGS. 7A to 8B.

Figure 7A:
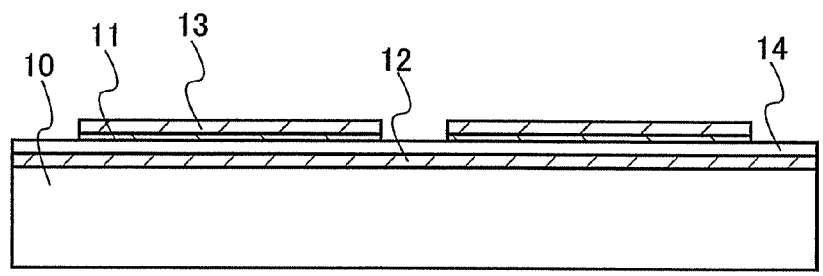
FIGS. 7A to 7E are cross-sectional views showing a method for manufacturing a field effect transistor.

In FIG. 7A, a base insulating layer 12 and a semiconductor layer 14 are formed over a substrate 10. Over the semiconductor layer 14, silicon nitride layers 11 and silicon oxide layers 13 are formed corresponding to element formation regions. The silicon oxide layers 13 are used as hard masks in etching the semiconductor layer 14 for element isolation. The silicon nitride layers 11 are etching stoppers.

The thickness of the semiconductor layer 14 is 5 nm to 30 nm, preferably 10 nm to 25 nm. In order to set the thickness within this range, after an amorphous silicon film is deposited to have a thickness within the range, the amorphous silicon film may be crystallized. Alternatively, after an amorphous silicon film with a thickness of 50 nm to 150 nm is crystallized, the thickness of the amorphous silicon film may be reduced by etching or grinding and polishing. A p-type impurity such as boron, aluminum, or gallium is added to the semiconductor layer 14 in order to control the threshold voltage. For example, as a p-type impurity, boron may be added at a concentration of greater than or equal to $5\times10^{17}$ cm$^{-3}$ and less than or equal to $1\times10^{18}$ cm$^{-3}$.

Figure 7B:
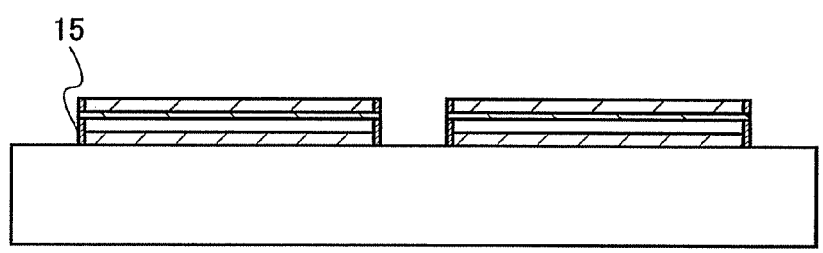

FIG. 7B shows a step of etching the semiconductor layer 14 and the base insulating layer 12 using the silicon oxide layers 13 as masks. End faces where the semiconductor layer 14 and the base insulating layer 12 are exposed are subjected to plasma treatment to be nitrided. By this nitridation treatment, silicon nitride layers 15 are formed at least on peripheral end portions of the semiconductor layers 14. The silicon nitride layers 15 have an insulating property and have an effect of preventing flow of a leak current at end faces of the semiconductor layer 14. Further, since the silicon nitride layers 15 have oxidation resistance, a bird's beak can be prevented from being formed between the semiconductor layer 14 and the base insulating layer 12 by growth of an oxide film from the end portion of the semiconductor layer 14.

Figure 7C:
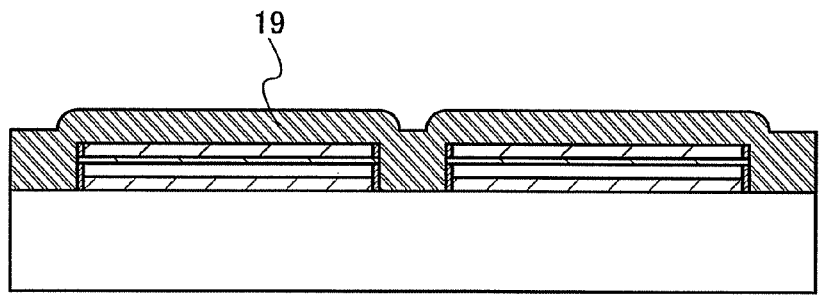

FIG. 7C shows a step of depositing an element isolation insulating layer 19. As the element isolation insulating layer 19, a silicon oxide film is deposited using TEOS by a CVD method. The element isolation insulating layer 19 is deposited thickly so that the semiconductor layer 14 is embedded therein.

Figure 7D:
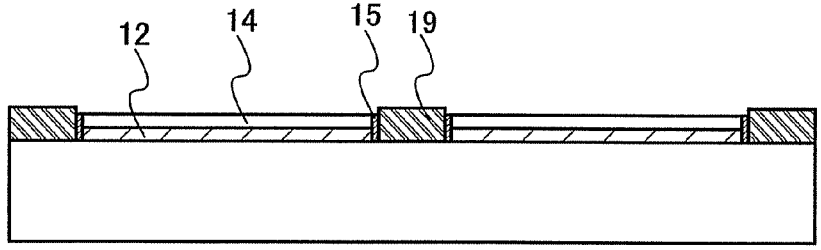

FIG. 7D shows a step for removing the element isolation insulating layer 19 until the silicon nitride layers 11 are exposed. This removal step can be performed by dry etching, or may be performed by chemical mechanical polishing treatment. The silicon nitride layers 11 serve as etching stoppers. The element isolation insulating layer 19 is provided around the semiconductor layer 14 and left to be embedded between the semiconductor layers 14. The silicon nitride layers 11 are removed afterwards.

Figure 7E:
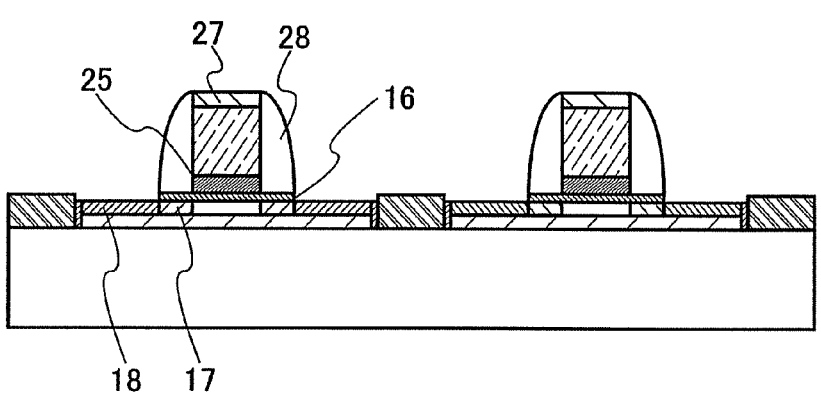

In FIG. 7E, after the semiconductor layers 14 are exposed, gate insulating layers 16, gate electrodes 25, and sidewall insulating layers 28 are formed as similar to FIGS. 6E and 6F, and first impurity regions 18 and second impurity regions 17 are formed. Insulating layers 27 are formed using silicon nitride and used as hard masks in etching the gate electrodes 25.

Figure 8A:
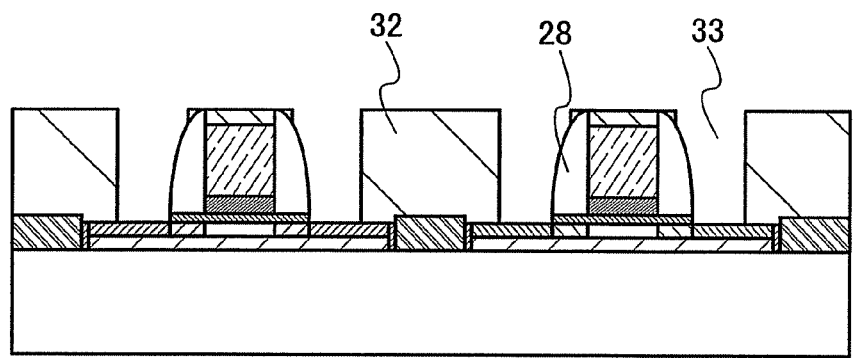
FIGS. 8A and 8B are cross-sectional views showing a method for manufacturing a field effect transistor.

In FIG. 8A, an interlayer insulating layer 32 is formed. For formation of the interlayer insulating layer 32, a BPSG (boron phosphorus silicon glass) film is formed and planarized by reflow. Alternatively, a silicon oxide film may be formed using TEOS (tetraethoxysilane) and planarized by chemical mechanical polishing treatment. In planarizing treatment, the insulating layers 27 over the gate electrodes 25 serve as etching stoppers. Contact holes 33 are formed in the interlayer insulating layer 32. The contact holes 33 are formed in a self-aligned manner utilizing the sidewall insulating layers 28.

Figure 8B:
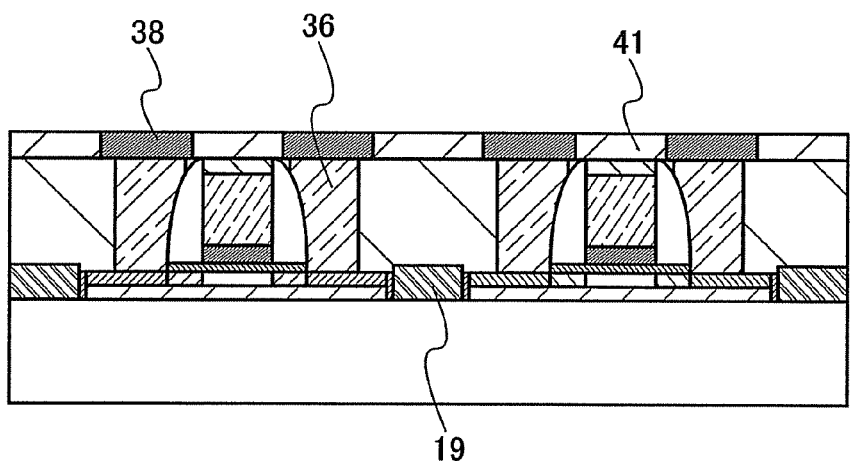

Then, as shown in FIG. 8B, contact plugs 36 are formed using tungsten hexafluoride by a CVD method. An insulating layer 41 is formed, openings are formed therein at a position corresponding to the contact plugs 36, and wirings 38 are provided in the openings. The wirings 38 are formed using aluminum or an aluminum alloy, and metal films such as a molybdenum film, a chromium film, or a titanium film are formed as a barrier metal for an upper layer and a lower layer of each wiring 38.

As described above, an integrated circuit including a field effect transistor and having an element isolation insulating layer 19 as the element isolation structure can be formed. In the filed effect transistor, a semiconductor layer has a thickness of 5 nm to 30 nm, preferably 10 nm to 25 nm, and the channel length is ten times or more and less than forty times the thickness of the semiconductor layer or is 100 nm or more and less than 1000 nm.

Figure 9:
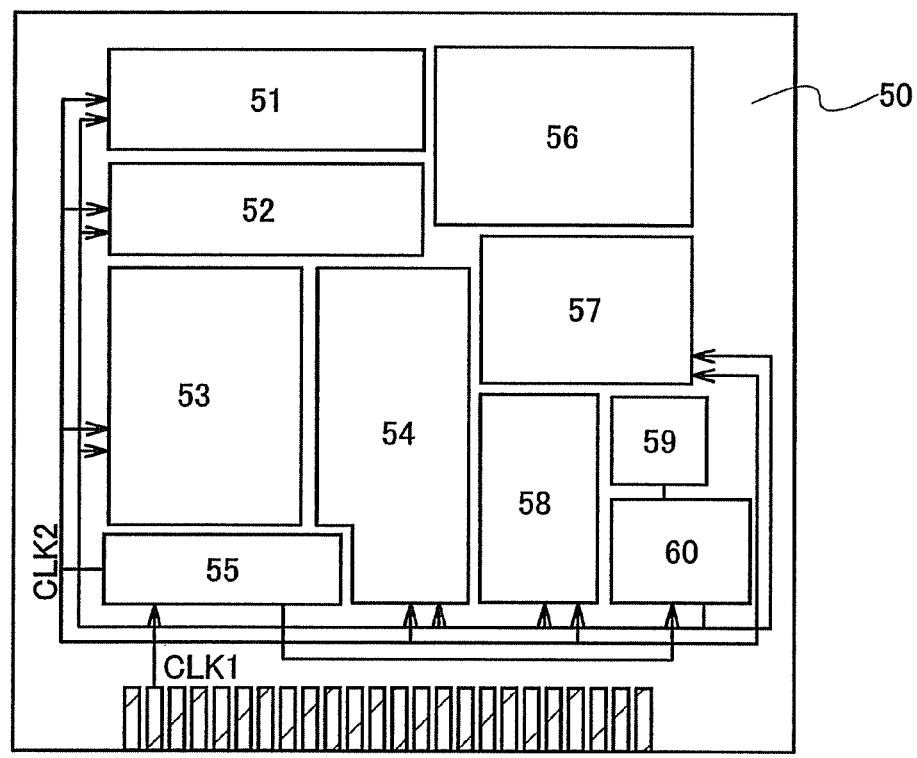
FIG. 9 is a diagram illustrating a configuration example of a microprocessor.

FIG. 9 shows an example of a microprocessor 50 having a semiconductor device of the present invention. This microprocessor 50 is configured with a filed effect transistor formed on an insulating surface as described above, in which the thickness of a semiconductor layer is 5 nm to 30 nm, preferably 10 nm to 25 nm, and a channel length is ten times or more and less than forty times the thickness of the semiconductor layer or is 100 nm or more and less than 1000 nm.

This microprocessor 50 has an arithmetic logic unit (also referred to as ALU) 51, an ALU controller 52, an instruction decoder 53, an interrupt controller 54, a timing controller 55, a register 56, a register controller 57, a bus interface (Bus I/F) 58, a read only memory (ROM) 59, and a memory interface (ROM I/F) 60. The read only memory 59 and the memory interface 60 may be provided in different chips.

An instruction inputted to the microprocessor 50 through the bus interface 58 is inputted to the instruction decoder 53 and decoded. Then, the instruction is inputted to the ALU controller 52, the interrupt controller 54, the register controller 57, and the timing controller 55. The ALU controller 52, the interrupt controller 54, the register controller 57, and the timing controller 55 perform various controls based on the decoded instruction. Specifically, the ALU controller 52 generates a signal for controlling the operation of the arithmetic logic unit 51. The interrupt controller 54 judges an interrupt request from an external input/output device or a peripheral circuit based on its priority or a mask state, and processes the request while a program is executed. The register controller 57 generates an address of the register 56, and reads/writes data from/to the register 56 in accordance with the state of the microprocessor.

The timing controller 55 generates signals for controlling timing of driving of the arithmetic logic unit 51, the ALU controller 52, the instruction decoder 53, the interrupt controller 54, and the register controller 57. For example, the timing controller 55 is provided with an internal clock generator for generating an internal clock signal CLK2 based on a reference clock signal CLK1, and supplies the clock signal CLK2 to each of the above-mentioned circuits.

It is to be noted that the microprocessor illustrated in FIG. 9 is just an example of the simplified structure, and practical microprocessors have various structures depending on usage.

According to the present invention, when the thickness of the semiconductor layer is formed to be thin, the amount of change in the threshold voltage is decreased and increase in the sub-threshold value is suppressed, whereby low voltage driving can be achieved. In addition, a gate leak current can be reduced at the step region (end region of the semiconductor layer) where the semiconductor layer and the gate electrode intersect with each other. Accordingly, low power consumption of the semiconductor device can be achieved.

Next, an example of a semiconductor device provided with an arithmetic function by which data can be transmitted/received without contact will be described with reference to FIG. 10.

Figure 10:
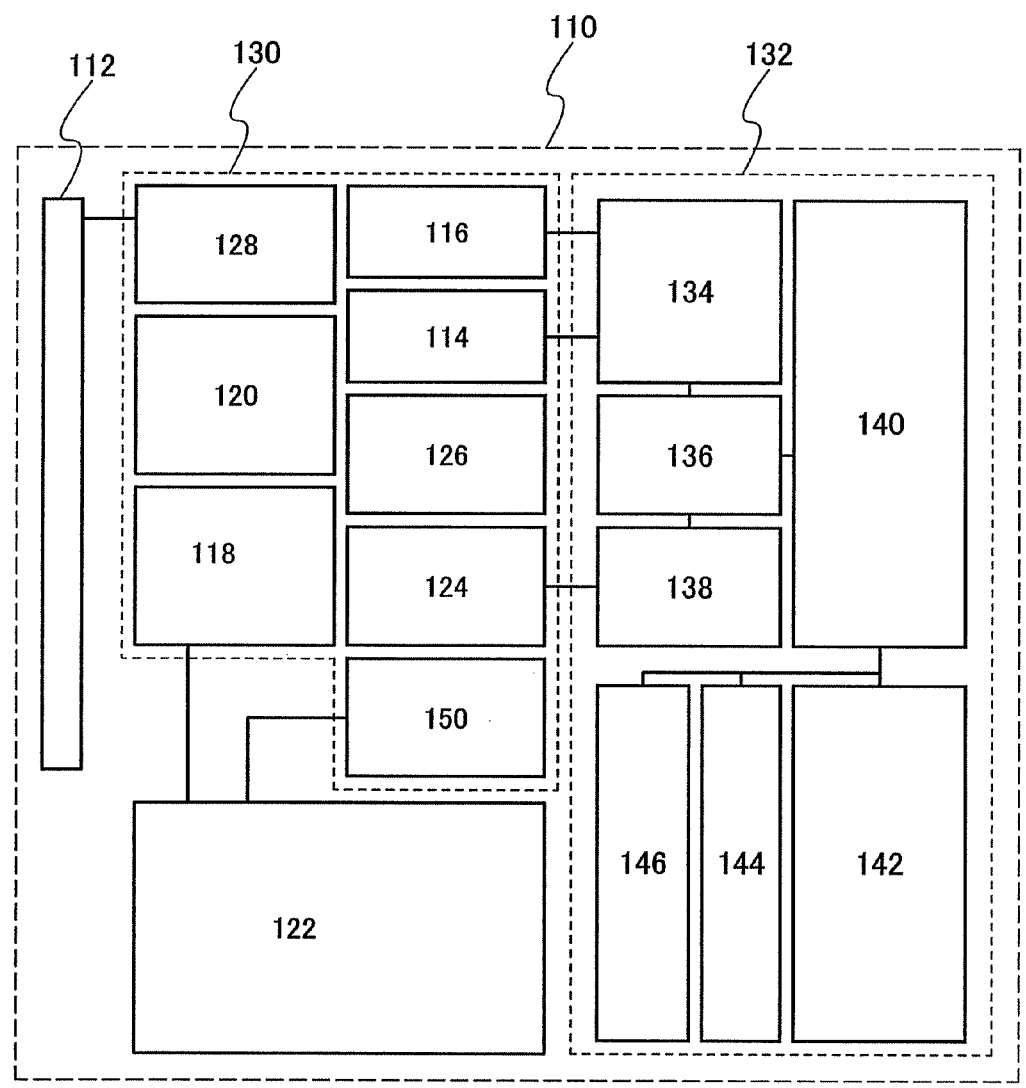
FIG. 10 is a diagram illustrating a configuration of a semiconductor device provided with an arithmetic function by which data can be transmitted/received without contact.

FIG. 10 shows a block diagram of a semiconductor device 110 transmits/receives signals to/from an external device by wireless communication. This semiconductor device 110 has an analog circuit portion 130 and a digital circuit portion 132. The analog circuit portion 130 includes a resonant circuit 128 having a resonant capacitor, a rectifier circuit 118, a constant voltage circuit 120, a reset circuit 126, an oscillator circuit 124, a demodulation circuit 116, a modulation circuit 114, and a power supply control circuit 150. The digital circuit portion 132 includes an RF interface 134, a control register 136, a clocked controller 138, an interface (CPU interface) 140, a central processing unit (CPU) 142, a random access memory (RAM) 144, and a read only memory (ROM) 146.

The operation of the semiconductor device 110 having such a structure is exemplary described below. A signal received at an antenna 112 causes induced electromotive force at the resonant circuit 128. The induced electromotive force is stored in a capacitor portion 122 via the rectifier circuit 118. The capacitor portion 122 is preferably formed using a capacitor such as a ceramic capacitor or an electric double layer capacitor. The capacitor portion 122 is not necessarily formed integrally with the semiconductor device 110 and may be attached as another component to a substrate having an insulating surface that partially constitutes the semiconductor device 110.

The reset circuit 126 generates a signal that resets the digital circuit portion 132 to be initialized. For example, the reset signal 126 generates, as a reset signal, a signal that rises with delay after increase in the power supply voltage. The oscillation circuit 124 changes the frequency and the duty ratio of a clock signal in accordance with a control signal generated by the constant voltage circuit 120. The demodulation circuit 116 having a low pass filter, for example, binarizes changes in amplitude of reception signals of an amplitude shift keying (ASK) system. The modulation circuit 114 changes the amplitude of transmission signals of an amplitude shift keying (ASK) system to be transmitted. The modulation circuit 114 changes the resonance point of the resonance circuit 128, thereby changing the amplitude of communication signals. The clock controller 138 generates a control signal for changing the frequency and the duty ratio of the clock signal in accordance with the power supply voltage or current consumption in the central processing unit 142. The power supply voltage is monitored by the power supply control circuit 150.

A signal that is inputted to the semiconductor device 110 from the antenna 112 is demodulated by the demodulation circuit 116, and then divided into a control command, data, and the like by the RF interface 134. The control command is stored in the control register 136. The control command includes, reading of data stored in the read only memory 146, writing of data to the random access memory 144, an arithmetic instruction to the central processing unit 142, and the like. The central processing unit 142 accesses the read only memory 146, the random access memory 144, and the control register 136 via the interface 140. The interface 140 has a function of generating an access signal for any one of the read only memory 146, the random access memory 144, and the control register 136 based on an address requested by the central processing unit 142.

As an arithmetic method of the central processing unit 142, a method may be employed in which the read only memory 146 stores an OS (operating system) and a reading program is executed at the time of starting operation. Alternatively, a method may be employed in which a circuit dedicated to arithmetic is formed and an arithmetic process is conducted using hardware. In a method in which both hardware and software are used, a method can be used in which a part of process is conducted in the circuit dedicated to arithmetic and the other part of the arithmetic process is conducted by the central processing unit 142 using a program.

When the capacitance of the capacitor portion 122 that supplies power needed for driving the semiconductor device 110 is increased, stable operation can be secured. However, to increase the capacitance of the capacitor portion 122 has a limitation. Thus, the threshold voltage and the sub-threshold value are reduced by reducing the thickness of the semiconductor layer as described in the present invention, so that it makes possible to drive the transistor at low voltage. As a result, low power consumption is achieved, which is effective.

This application is based on Japanese Patent Application serial no. 2006-327718 filed with Japan Patent Office on Dec. 5, 2006, the entire contents of which are hereby incorporated by reference.

What is claimed is:

1. A semiconductor device comprising:
    an insulating layer having a first region and a second region thinner than the first region;
    a semiconductor layer with a thickness of 10 nm to 25 nm on the first region;
    a first insulating layer on a side surface of the semiconductor layer;
    a side-wall insulating layer at the side surface of the semiconductor layer with the first insulating layer interposed therebetween;
    a gate insulating layer over the semiconductor layer;
    a gate electrode over the gate insulating layer; and
    a second insulating layer over and in contact with the gate electrode, a side surface of the gate insulating layer, the second region, a top surface of the semiconductor layer, the first insulating layer, and the side-wall insulating layer,
    wherein a thickness of the gate insulating layer is 2 nm or more and less than 20 nm,
    wherein a channel length is ten times or more and less than forty times the thickness of the semiconductor layer.

2. A semiconductor device according to claim 1,
    wherein a concentration of an impurity element imparting one conductivity type contained in a channel formation region of the semiconductor layer is greater than or equal to $5 \times 10^{17}$ cm$^{-3}$ and less than or equal to $1 \times 10^{18}$ cm$^{-3}$.

3. A semiconductor device according to claim 2,
    wherein the impurity element imparting one conductivity type is a p-type impurity.

4. A semiconductor device according to claim 3,
    wherein the p-type impurity is one sort or plural sorts of elements selected from boron, aluminum, and gallium.

5. A semiconductor device according to claim 1,
    wherein the gate insulating layer is formed of a silicon oxide layer or has a stacked structure of a silicon oxide layer and a silicon nitride layer.

6. A semiconductor device according to claim 1,
    wherein the gate electrode has a first layer formed of metal nitride and a second layer formed of metal.

7. A semiconductor device according to claim 1,
    wherein the gate insulating layer has a stacked structure of a silicon oxide layer and a silicon nitride layer,
    wherein the gate electrode has a first layer formed of metal nitride and a second layer formed of metal, and
    wherein the silicon nitride layer is provided between the first layer formed of metal nitride of the gate electrode and the silicon oxide layer of the gate insulating layer.

8. A semiconductor device according to claim 1,
wherein the semiconductor layer has a plurality of crystalline regions of plane directions which are different from each other.

9. A microprocessor using a semiconductor device described in claim 1.

10. A semiconductor device comprising:
an insulating layer having a first region and a second region thinner than the first region;
a semiconductor layer with a thickness of 10 nm to 25 nm on the first region;
a first insulating layer on a side surface of the semiconductor layer;
a side-wall insulating layer at the side surface of the semiconductor layer with the first insulating layer interposed therebetween;
a gate insulating layer over the semiconductor layer;
a gate electrode over the gate insulating layer; and
a second insulating layer over and in contact with the gate electrode, a side surface of the gate insulating layer, the second region, a top surface of the semiconductor layer, the first insulating layer, and the side-wall insulating layer,
wherein a thickness of the gate insulating layer is 2 nm or more and less than 20 nm,
wherein a channel length is 100 nm or more and less than 1000 nm.

11. A semiconductor device according to claim 10,
wherein a concentration of an impurity element imparting one conductivity type contained in a channel formation region of the semiconductor layer is greater than or equal to $5\times10^{17}$ cm$^{-3}$ and less than or equal to $1\times10^{18}$ cm$^{-3}$.

12. A semiconductor device according to claim 11,
wherein the impurity element imparting one conductivity type is a p-type impurity.

13. A semiconductor device according to claim 12,
wherein the p-type impurity is one sort or plural sorts of elements selected from boron, aluminum, and gallium.

14. A semiconductor device according to claim 10,
wherein the gate insulating layer is formed of a silicon oxide layer or has a stacked structure of a silicon oxide layer and a silicon nitride layer.

15. A semiconductor device according to claim 10,
wherein the gate electrode has a first layer formed of metal nitride and a second layer formed of metal.

16. A semiconductor device according to claim 10,
wherein the gate insulating layer has a stacked structure of a silicon oxide layer and a silicon nitride layer,
wherein the gate electrode has a first layer formed of metal nitride and a second layer formed of metal, and
wherein the silicon nitride layer is provided between the first layer formed of metal nitride of the gate electrode and the silicon oxide layer of the gate insulating layer.

17. A semiconductor device according to claim 10,
wherein the semiconductor layer has a plurality of crystalline regions of plane directions which are different from each other.

18. A microprocessor using a semiconductor device described in claim 10.

19. A semiconductor device according to claim 1,
wherein a threshold voltage is 0.01 V or more and less than 0.62 V, and a sub-threshold value is 60 mV/decade or more and less than 100 mV/decade.

20. A semiconductor device according to claim 10,
wherein a threshold voltage is 0.01 V or more and less than 0.62 V, and a sub-threshold value is 60 mV/decade or more and less than 100 mV/decade.

21. A semiconductor device according to claim 1,
wherein a thickness of the first insulating layer is 1 nm to 5 nm.

22. A semiconductor device according to claim 10,
wherein a thickness of the first insulating layer is 1 nm to 5 nm.

* * * * *